United States Patent [19]
Ellinger et al.

[11] Patent Number: 6,013,984
[45] Date of Patent: Jan. 11, 2000

[54] ION ENERGY ATTENUATION METHOD BY DETERMINING THE REQUIRED NUMBER OF ION COLLISIONS

[75] Inventors: Steve Ellinger, Williston; Joseph Fernandez, Shelburne, both of Vt.

[73] Assignee: Lam Research Corporation, Fremont, Calif.

[21] Appl. No.: 09/095,167

[22] Filed: Jun. 10, 1998

[51] Int. Cl.[7] .................................................. H05H 1/24
[52] U.S. Cl. ...................... 315/111.21; 361/234
[58] Field of Search ...................... 315/111.21; 118/728; 156/345 PW; 361/234

[56] References Cited

U.S. PATENT DOCUMENTS

| | | | |
|---|---|---|---|
| 5,572,398 | 11/1996 | Federlin et al. | 361/234 |
| 5,606,485 | 2/1997 | Shamouilian et al. | 361/234 |
| 5,740,009 | 4/1998 | Pu et al. | 361/234 |

Primary Examiner—Justin P. Bettendorf
Attorney, Agent, or Firm—Beyer & Weaver, LLP.

[57] ABSTRACT

A method and an apparatus for controlling the location where the formation of a contamination layer occurs in a plasma processing system is disclosed. The control is accomplished by reducing the released ion's kinetic energy to approximately at most the surface potential of the selected surface to which it is to combine within the desired location.

9 Claims, 7 Drawing Sheets

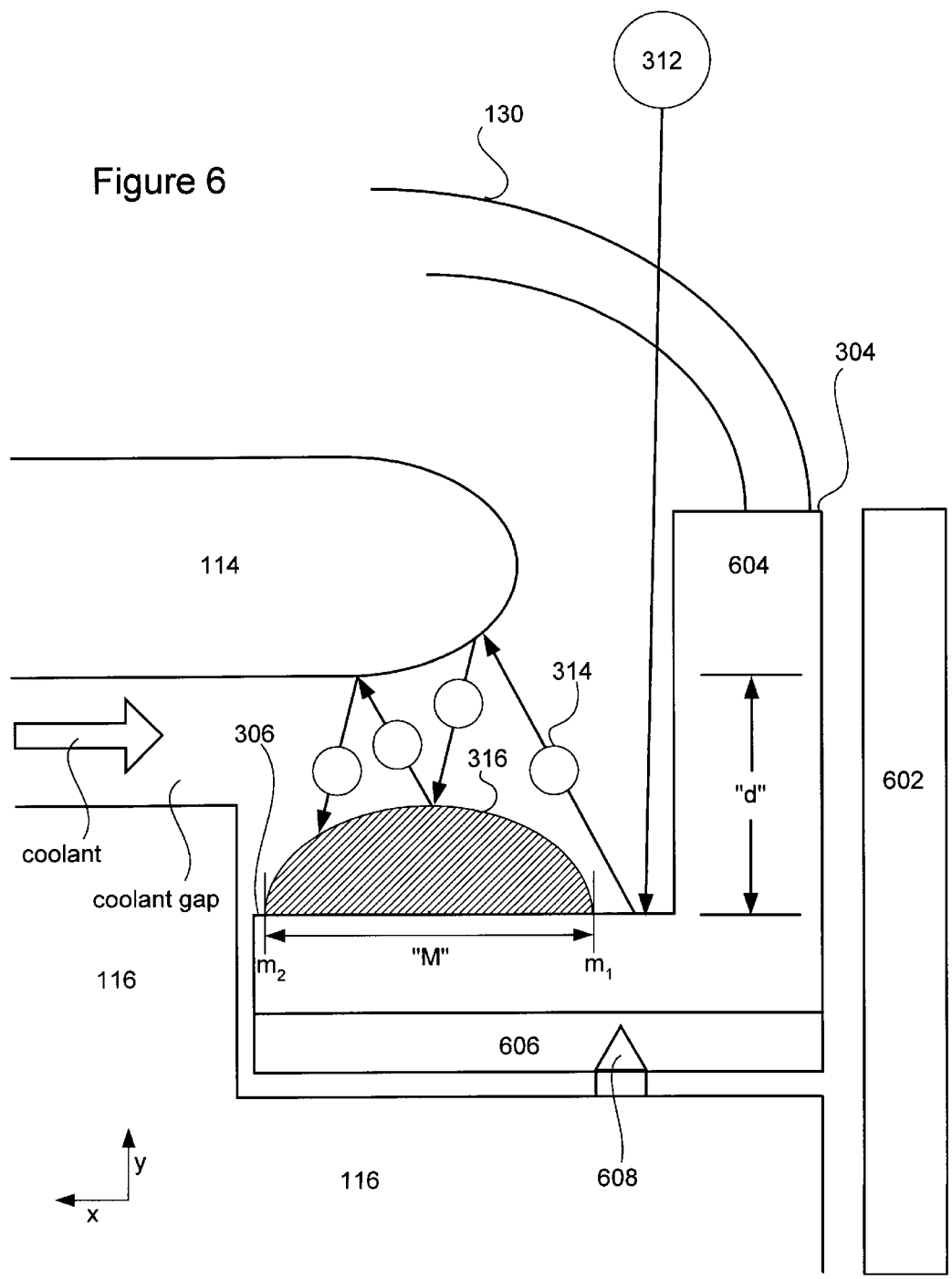

ION ENERGY ATTENUATION METHOD BY DETERMINING THE REQUIRED NUMBER OF ION COLLISIONS

BACKGROUND OF THE INVENTION

1. Field of the Invention

The present invention generally relates to plasma processing. More particularly, methods and apparatuses for controlling process related contamination are described.

2. Description of the Related Art

The present invention relates to semiconductor devices and apparatus for their manufacture. More particularly, the present invention relates to improved apparatus and methods for aligning a semiconductor substrate on a bipolar electrostatic chuck to a focus ring in a plasma processing chamber.

The use of plasma enhanced processes in the manufacture of semiconductor based products (such as integrated circuits and flat panel displays) is well known. Generally speaking, plasma enhanced processes involve the processing of a substrate (e.g., a glass panel or a semiconductor wafer) in a plasma processing chamber. Within the plasma processing chamber, a plasma may be ignited out of appropriate etchant or deposition source gases to respectively etch or deposit a layer of material on the surface of the substrate.

To facilitate discussion, FIG. 1 illustrates a simplified inductively coupled plasma processing system, representing a suitable plasma processing system for performing plasma enhanced processes on substrates. To simplify the illustration, FIG. 1 as well as the figures herein has not been drawn to scale. It should be borne in mind, however, that although an inductively coupled plasma processing system is discussed in detail in this disclosure, the invention disclosed herein may be employed in any known plasma processing system, including processing systems adapted for deposition, cleaning, and/or etching. With respect to etching systems, the invention may be employed in, for example, inductively coupled plasma etching, dry etching, reactive ion etching (RIE), magnetically enhanced reactive ion etching (MERIE), electron cyclotron resonance (ECR) etching, or the like. Note that the above is true regardless of whether energy to the plasma is delivered through capacitively coupled parallel electrode plates, through ECR microwave plasma sources, or through inductively coupled RF sources such as helicon, helical resonators, and coil arrangements (whether planar or non planar). ECR and inductively coupled plasma processing systems, among others, are readily available commercially. Inductively coupled plasma systems such as the TCP brand inductively coupled plasma systems are available from Lam Research Corporation of Fremont, Calif.

Referring now to FIG. 1, a plasma processing system 100 includes a plasma processing chamber 102. Above chamber 102, there is disposed an electrode 104, which is implemented by a coil in the example of FIG. 1. Electrode 104 is energized by a radio frequency (RF) generator 106 via conventional matching network 108. In the example of FIG. 1, RF generator 106 sources RF energy having a frequency of about 13.56 MHz, although other suitable frequencies may be employed as well.

To facilitate plasma enhancing processing, the etchant or deposition source gas is flowed through the shower head 110 and ignited by the RF energy supplied by the RF generator 106 and RF generator 118 having matching network 120. During plasma enhanced processing, the by-product gases are exhausted out of chamber 102 through exhaust port 122.

After plasma enhanced processing is completed, substrate 114 is removed from plasma processing chamber 102 and may undergo additional processing steps to form the completed flat panel display or integrated circuit, for example.

In FIG. 1, a focus ring 124 supported and aligned by a filler ring 125 are shown. In the example of FIG. 1, a portion of focus ring 124 underlies substrate 114 and overlaps a portion of substrate holding chuck 116. As is well known to those familiar with the plasma processing art, the focus ring 124 helps focus the ions from the RF induced plasma region 112 on the surface of substrate 114 to improve process uniformity, particularly at the edge of the substrate 114. This is because when RF power is supplied to substrate holding chuck 116 (from radio frequency generator 118), equipotential field lines are set up over substrate 114 and focus ring 124. These field lines are not static but change during the RF cycle. The time averaged field results in the bulk plasma being positive and the surface of 114 and 116 negative. Due to geometry factors, the field lines are not uniform at the edge of the substrate 114. The focus ring 124 helps direct the bulk of the RF coupling through substrate 114 to the overlying plasma by acting as a capacitor between the plasma and the powered electrode (e.g., RF-powered chuck 116).

During plasma processing, the positive ions accelerate across the equipotential field lines (shown representatively in FIG. 1 as equipotential lines 130) to impinge on the surface of substrate 114, thereby providing the desired processing effect (such as deposition or anisotropic etching). Although ion acceleration and impact upon substrate 114 are generally desirable if properly controlled, such ion acceleration and impact upon focus ring 124 tend to unduly erode focus ring 124. In the prior art, focus ring erosion is typically thought to be unavoidable. By way of example, system designers in the prior art may for focus ring 124 out of a material generally similar to that employed to form the walls of plasma processing chamber 102 or substrate 114 so that erosion does not introduce a different type of particulate contamination into the chamber. A popular material for use in forming the focus ring 124 in the prior art is aluminum oxide ($Al_2O_3$).

Referring now to FIG. 2 which depicts in greater detail a portion of the prior art focus ring as installed in the plasma processing system of FIG. 1. As is known by those skilled in the art, aluminum oxide is a material with a relatively high di-electric constant. Because of this, a relatively high potential difference exists between the upper surface 134 of focus ring 124 and the plasma sheath. This potential difference manifests itself by the presence of multiple equipotential field lines 130 along upper surface 134 of focus ring 124. The presence of multiple equipotential field lines over upper surface 134 causes the ions from RF induced plasma region 112 to impinge with a relatively high level of kinetic energy on the upper surface 134 of focus ring 124 since ions tend to accelerate across equipotential field lines in a direction orthogonal to the field lines themselves.

Ion impact on upper surface 134 causes, in addition to the aforementioned contamination problem, other undesirable consequences. For example, if enough of focus ring 124 is eroded away by the impinging ions, the eroded focus ring material in the form of Al ions, for example, deposit on a variety of surrounding surfaces. More particularly, an impinging plasma ion 150 impacts the surface 134 of the focus ring 124 and knocks off contamination, typically in the form of Al atoms represented by Al atom 152. The Al atom 152, in turn, undergoes collisions with the substrate 114 and the focus ring 124 losing a portion of its initial kinetic at each collision. When the contaminant ion has undergone a sufficient number of these collisions to reduce its kinetic energy below a surface threshold energy, the contaminant ion is captured by the surface upon which it collides to form a layer of contamination 156.

In the prior art, the gap distance "d" measured from the surface 134 of the focus ring to the lower surface of the substrate 114 is typically never less than 0.006 inches (6 mils) and is as high as 0.014 inches (14 mils). In this range, the distance "L" traversed in the "x" direction by the contaminant ions before their kinetic energies are reduced to below the surface potential can be as large as the distance "L" to the chuck 116. In this case, the contamination layer 156 may stick to the underside of the substrate 114 and/or the focus ring 124 in proximity to the coolant gap, or to the chuck 116 itself When the contamination layer 156 is in proximity to the coolant gap, the coolant gap may become substantially larger thereby increasing the flow of coolant gases. This increase in the distance between the chuck and the substrate causes the cooling gas to be ineffective thereby causing the substrate 114 to overheat.

In addition, the build up of contaminant on the chuck 116 increases the number of maintenance cycles required to clean the focus ring 124 as well as the chuck 114. This increase in required maintenance reduces the capability of the plasma reactor 100 to plasma process substrates as desired.

In view of the foregoing, there are desired improved techniques for reducing contamination build up on substrates processed in a plasma processing chamber.

SUMMARY OF THE INVENTION

These and other advantages of the present invention will become apparent upon reading the following detailed descriptions and studying the various figures of the drawings.

In one aspect of the invention a method of controlling the formation of a contamination layer in a plasma processing system to within a prescribed location is disclosed. The contamination layer is formed of at least an ion released from a selected surface having an associated surface potential by the action of a plasma ion upon the selected surface. The selected surface being included in the plasma processing system. The inventive method may be practiced by the following operations. First, the average kinetic energy of the plasma ion is determined. Next, the surface potential of the selected surface is determined. Next, the approximate number of collisions between the selected surface and the released ion required to reduce the released ion's kinetic energy to approximately at most the surface potential of the selected surface is determined. Finally, arranging for the released ion to undergo the determined number of collisions such that it cannot escape the selected surface within the prescribed location.

In another aspect of the invention, a method of attenuating the kinetic energy of an ion to below a surface potential of a surface within a prescribed distance is disclosed. The ion is released from the surface by the collision between a plasma ion produced in a plasma processing system and the surface. The surface potential being at least the kinetic energy required by the released ion to escape the surface. When the kinetic energy of the released ion is less than the surface potential of the surface, the released ion cannot escape the surface and combines therewith. The prescribed distance being sufficiently removed from a specified structure included in the plasma processing system to avoid contamination thereof. The plasma processing system includes a plasma processing chamber having a substrate, a substrate-holding chuck, a focus ring, and a filler ring configured to mechanically support at least a portion of the focus ring. The focus ring being configured to overlap at least a portion of the substrate-holding chuck that is powered by radio-frequency (RF) power during plasma operation to act as an electrode. The substrate being configured to overlap a portion of the focus ring that overlaps the portion of the substrate-holding chuck. The inventive method is practiced by the following operations. First, a plasma having at least a plasma ion with an average kinetic energy is formed in the plasma processing chamber. Next, the proximate location of collision between the selected surface and the plasma ion is determined. Next, a gap between a lower surface of the substrate and an upper portion of the focus ring is formed. The gap having a gap distance sufficient to cause the released ion to undergo sufficient number of collisions to reduce the average kinetic energy of the released ion to at most the surface potential of the selected surface within the prescribed distance.

In yet another aspect of the invention, a filler ring configured for use in a plasma processing chamber is disclosed. The plasma chamber has a substrate, a substrate-holding chuck, and a focus ring. The filler ring is also configured to mechanically support at least a portion of the focus ring, the focus ring being configured to overlap at least a portion of the substrate-holding chuck. The substrate holding chuck is powered by radio-frequency (RF) power during plasma operation to act as an electrode. The substrate being configured to overlap a portion of the focus ring that overlaps the portion of the substrate-holding chuck forming thereby a gap. The gap being useful for at least the removal of coolant gases from beneath the substrate during plasma operation. In this aspect of the invention, a lower surface of the substrate forms an upper portion of the gap and an upper surface of the focus ring forms a lower portion of the gap. The filler ring includes a filler ring body having an upper surface in mechanical support contact with the focus ring. The filler ring also includes a gapping device in direct contact with the filler ring body. The gapping device being used to set a distance between the lower surface of the substrate and the upper surface of the focus ring. The set distance provides the capability for determining the location of the formation of a contamination layer formed within the gap when the focus ring is eroded by plasma during the plasma processing.

BRIEF DESCRIPTION OF THE DRAWINGS

The present invention is illustrated by way of example, and not by way of limitation, in the figures of the accompanying drawings. In the following figures, like reference numerals refer to analogous or similar elements to facilitate ease of understanding.

FIG. 6 depicts, in accordance with another embodiment of the invention, a portion of the inventive filler ring and associated focus ring capable of maintaining a specified gap between the surface of focus ring and a substrate.

DETAILED DESCRIPTION OF THE PREFERRED EMBODIMENTS

Figure 1:
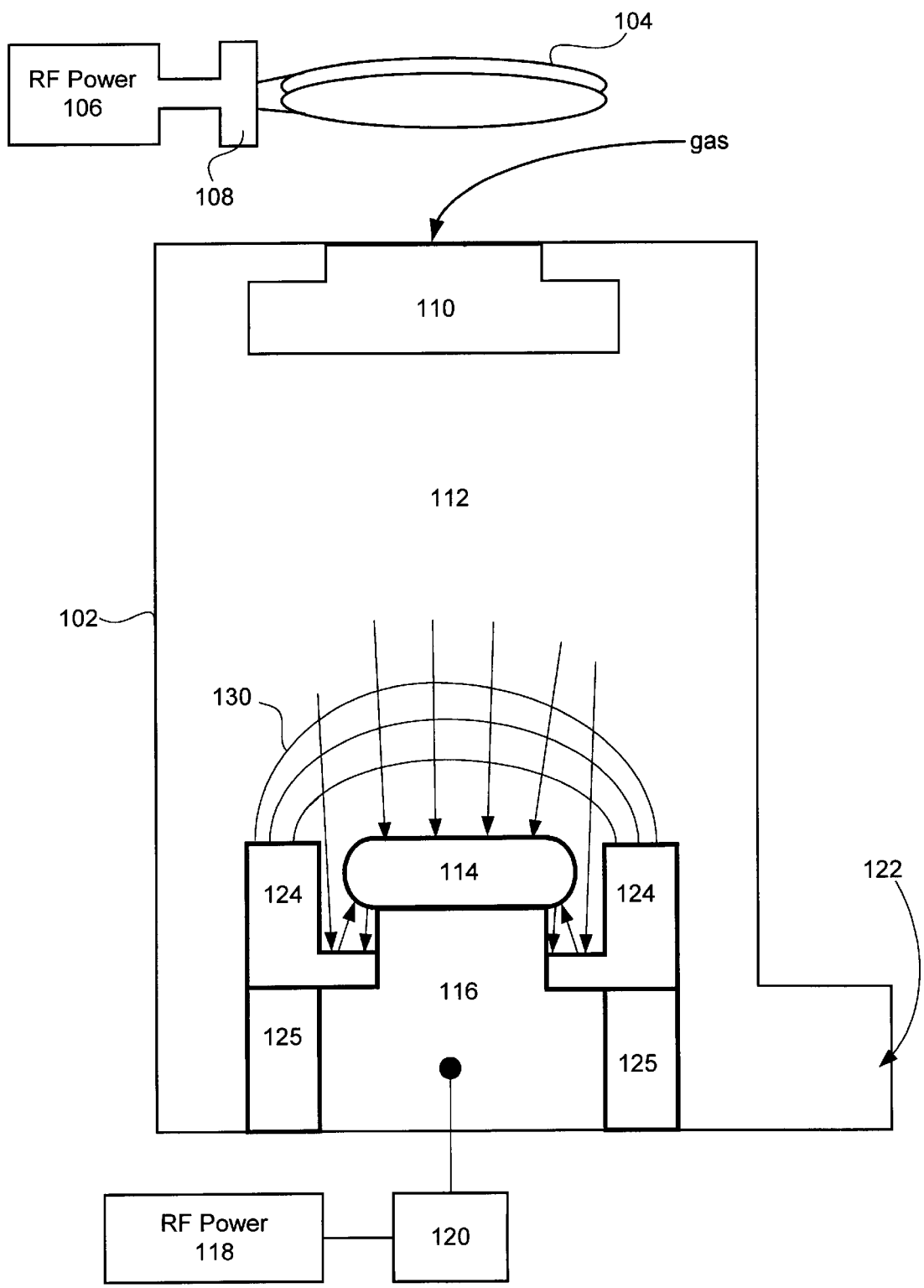
FIG. 1 illustrates, to facilitate discussion, a typical plasma substrate processing system.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

In accordance with one aspect of the invention, a method of controlling the formation of a contamination layer in a plasma processing system to within a prescribed location is disclosed. The contamination layer is formed of at least an ion released from a selected surface having an associated surface potential by the action of a plasma ion upon the selected surface. The selected surface being included in the plasma processing system. The inventive method may be practiced by the following operations. First, the average kinetic energy of the plasma ion is determined. Next, the surface potential of the selected surface is determined. Next, the approximate number of collisions between the selected surface and the released ion required to reduce the released ion's kinetic energy to approximately at most the surface potential of the selected surface is determined. Finally, arranging for the released ion to undergo the determined number of collisions such that it cannot escape the selected surface within the prescribed location.

In another aspect of the invention, a method of attenuating the kinetic energy of an ion to below a surface potential of a surface within a prescribed distance is disclosed. The ion being released from the surface by the collision between a plasma ion produced in a plasma processing system and the surface. The surface potential being at least the kinetic energy required by the released ion to escape the surface. When the kinetic energy of the released ion is less than the surface potential of the surface, the released ion cannot escape the surface and combines therewith. The prescribed distance being sufficiently removed from a specified structure included in the plasma processing system to avoid contamination thereof.

In accordance with another aspect of the invention, a filler ring is constructed capable of controlling the distance between a substrate and an underlying surface of an associated focus ring to form a gap. The gap providing a mechanism whereby both coolant gases are effectively exhausted and contamination created by plasma ion bombardment of the focus ring is substantially reduced. By controlling the distance between the substrate and the associated underlying surface of the focus ring to within a specified range, the inventive filler ring is capable of substantially reducing the formation of a contamination layer in proximity to the portion of the chuck supporting the substrate such that maintenance time is commensurably reduced and plasma processing system throughput is commensurably increased. In addition, the contamination layer formed on the substrate itself is substantially reduced.

Figure 2:
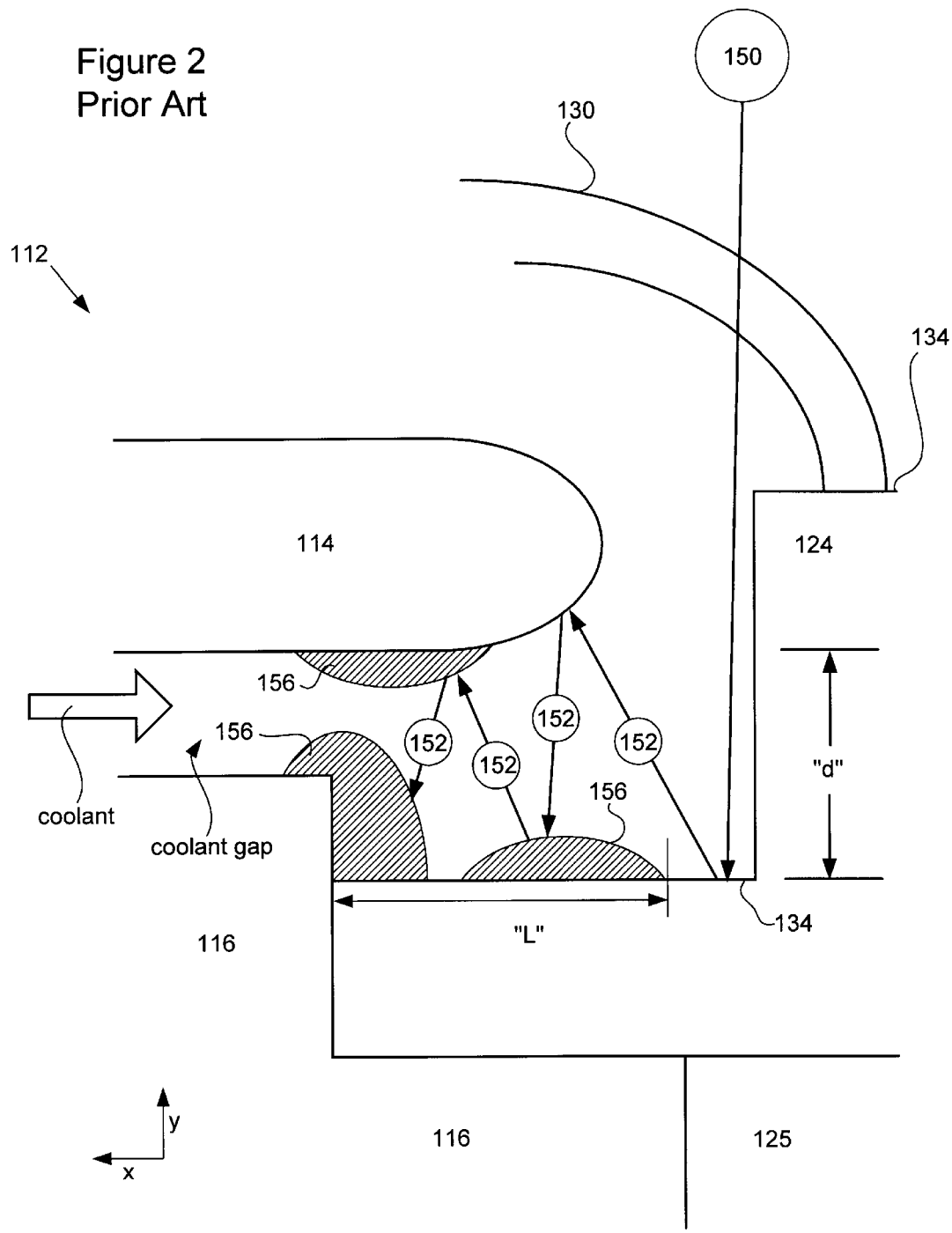
FIG. 2 depicts in greater detail a portion of the prior art focus ring as installed in the plasma processing system of FIG. 1.
Figure 3:
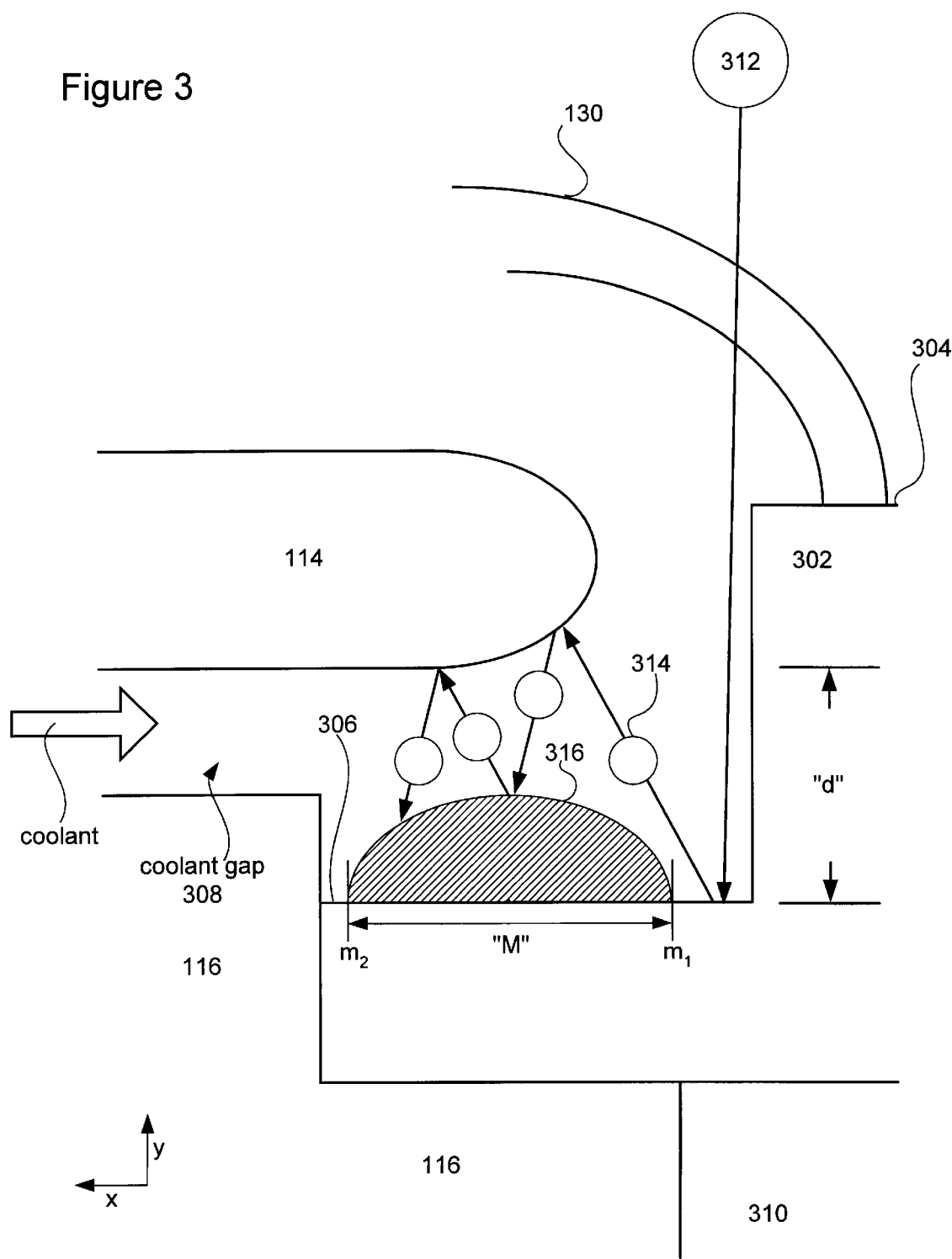
FIG. 3 depicts, in accordance with one embodiment of the invention, a portion of the inventive filler ring and associated focus ring capable of maintaining a specified gap between the surface of focus ring and a substrate.

Referring to FIG. 3, substrate 114 and chuck 116 are again shown. It should be noted that a coolant gap through with coolant gases flow is formed by the proximally positioning of the chuck 116 to the substrate 114. A focus ring 302 represents a focus ring whose shape is substantially similar to that of focus ring 124 of FIGS. 1 and 2. It should be appreciated that in a specific system, the specific shape of the focus ring 302 may vary depending of the arrangement of chuck 116, substrate 114 and/or others. Therefore the exact shape of focus ring 302 of FIG. 3 is shown for illustration purposes only and in not limiting in any way.

Focus ring 302 preferably has a first surface 304 that is directly exposed to the plasma environment during plasma processing. Focus ring 302 further includes a second surface 306 which underlies the substrate 114 and overlies a portion of the chuck 116. In the described embodiment, a gap 308 formed between the substrate 114 and the second surface 306 has a vertical dimension "d" controlled by a filler ring 310. The filler ring 310 is capable of controlling the vertical dimension "d" of the gap 308 in many ways, one of which is accomplished by moving the focus ring 302 in a vertical direction as appropriate. It should be noted that vertical direction is any direction substantially parallel to a "y" axis, as shown in FIG. 3. Similarly, a reference to horizontal direction, is that direction which is substantially parallel to an "x" axis also shown in FIG. 3.

In one embodiment of the invention, the filler ring 310 underlies the focus ring 302 in a ring like fashion when viewed from the top of the substrate 114. In addition, the second surface 306 of the focus ring 302 overlaps the chuck 116. It should be understood that this chuck-overlapping portion (i.e., the second surface 306) substantially surrounds substrate 114 in a ring-like fashion when viewed from the top of the substrate 114.

In accordance with one embodiment of the invention, the filler ring 310 moveably supports the focus ring 302. The filler ring 310 provides therefore, mechanical support for the focus ring 302 as well as the capability to control the gap distance "d" to within a specified range. In one aspect of the invention, the filler ring 310 is capable of forming the gap 308 with an associated gap distance "d" ranging between approximately 0.5 mils to less than 6 mils.

With the focus ring 302, equipotential field lines 130 remain substantially parallel to the portion of the focus ring 302 that overlaps chuck 116 due to relatively high dielectric constant of the focus ring material, typically being aluminum oxide. Consequently, ions 312 from the plasma sheath accelerate perpendicularly to the equipotential field lines to toward upper surface 304 of focus ring 302 to impinge thereupon. The impact of the plasma ion 312 typically results in the release of ions 314 from the surface 304 of the focus ring 302. In the case where the focus ring 302 is formed of aluminum oxide, the ion 314 released from the surface 304 of the focus ring 302 is typically one of Al. In order to escape the surface 304, the ion 314 must have sufficient kinetic energy to overcome what is referred to as the surface potential ($\mu$) of the surface 304. By escaping the surface 304, the kinetic energy of the ion 314 is commensurably reduced by the value of the surface potential tt from that which was imparted to it by the impinging plasma ion 312. The constant bombardment of the upper surface 304 of the focus ring may be eroded away, permitting ions to directly impinge on chuck 116, leading to chuck damage.

Once released from the surface of the focus ring 302, the ion 314 undergoes further collisions with any surface upon which it collides. Such surfaces include the portion of the substrate 114 overhanging the focus ring 302 as well as the surface 306. At each collision, the ion 314 loses a portion of its kinetic energy to any surface upon which it collides. This loss in kinetic energy is due to at least the fact that the ion 314 loses at least the amount of kinetic energy equal to the surface potential R of the surface upon which it collides. An analogous situation is the fact that in order for any object to escape the surface of the Earth, it must have a velocity at least as great as the escape velocity at the surface of the Earth.

Therefore, each collision which the ion 314 undergoes reduces it kinetic energy by at least the surface potential of the surface upon which it collides. When enough of these collisions occur to reduce the kinetic energy of the ion 314 to below the surface potential $\mu$ of the surface which it collides, the ion 314 is incapable of escaping that surface. In that case, the trapped ion may "condense" on the surface, or it may combine with plasma residues on the surface. In either case, a layer of contamination 316 forms on the surface from which the ion 314 cannot escape.

As detailed above, the layer of contamination 316 being a source of many problems, it is therefore desirable to be able to control location where the layer of contamination 316 forms. One aspect of the invention takes advantage of the fact already discussed regarding the kinetic energy reducing collisions which the ion 314 undergoes. By controlling a horizontal distance M from the point of formation $m_1$ to the point of condensation $m_2$ of the ion 314, the layer of contamination 316 can be influence to form in a non-critical location removed from critical structures. Such critical structures can include, for example, the coolant gap, the chuck 116, and/or the substrate 114.

One approach to controlling the horizontal distance M defining the desired location of the layer of contamination 316 is by compelling the ion 314 to undergo sufficient collisions to reduce its kinetic energy to below the surface potential $\mu$ of the surface 306. In this way, the ion 314 will condense, or other wise, form the layer of contamination 316 within the desired desired location defined by the distance M. In one aspect of the invention, the gap distance "d" is controlled to a range of less than approximately 6 mils (i.e., 0.006 inches) by the filler ring 310. In this way, the ion 314 undergoes collisions within the distance M sufficient to reduce its kinetic energy to below the surface potential of the second surface 306 such that it cannot escape the second surface 306.

Figure 4:
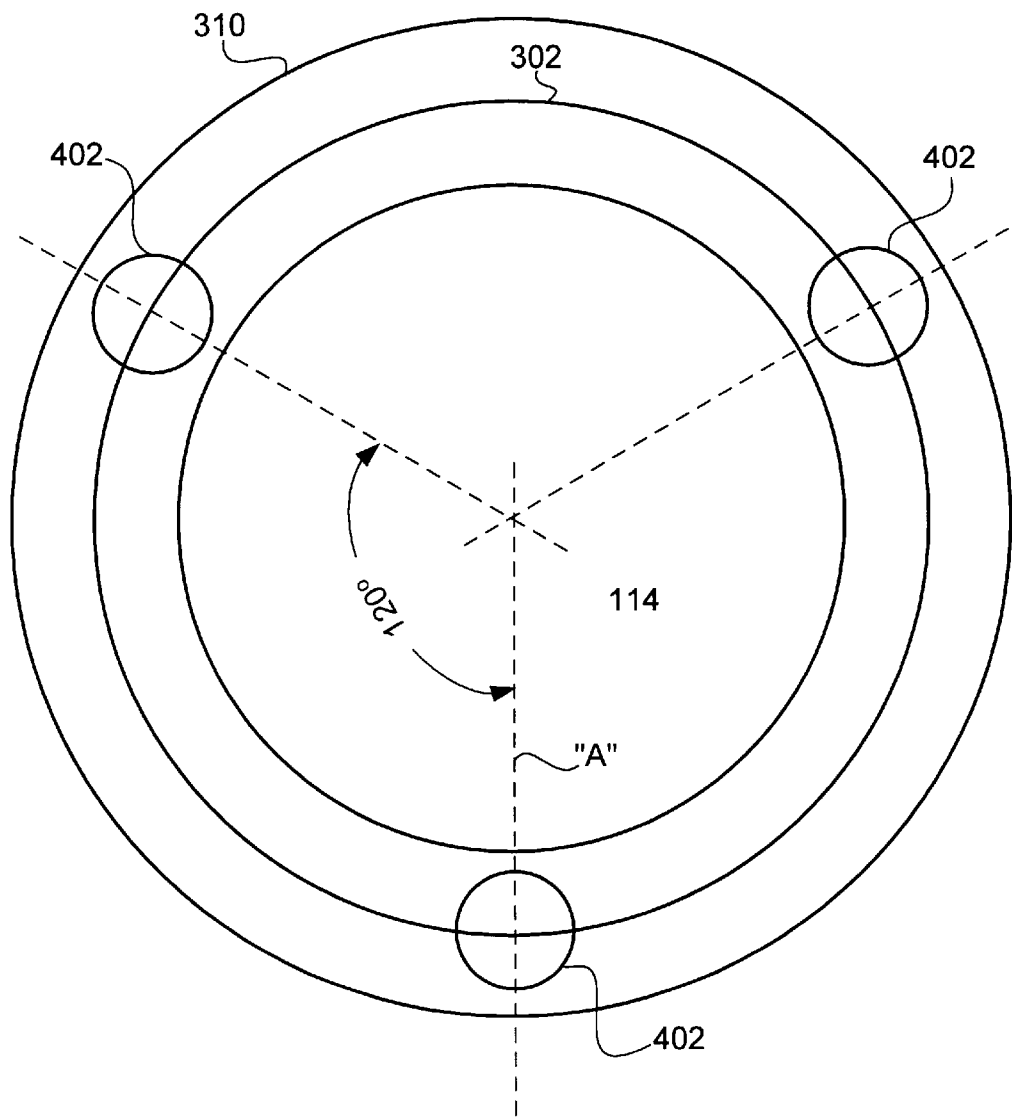
FIG. 4 illustrates, in accordance with one embodiment of the present invention, a top view of a substrate, focus ring and associated filler ring.

FIG. 4 is an illustration of the substrate 114, the focus ring 302, and the filler ring 310 in a top view representation in accordance with an embodiment of the invention. It should be noted that the substrate 114, the focus ring 302, and the filler ring 310 will be described in the context of FIG. 3 and all references included therein.

Figure 4A:
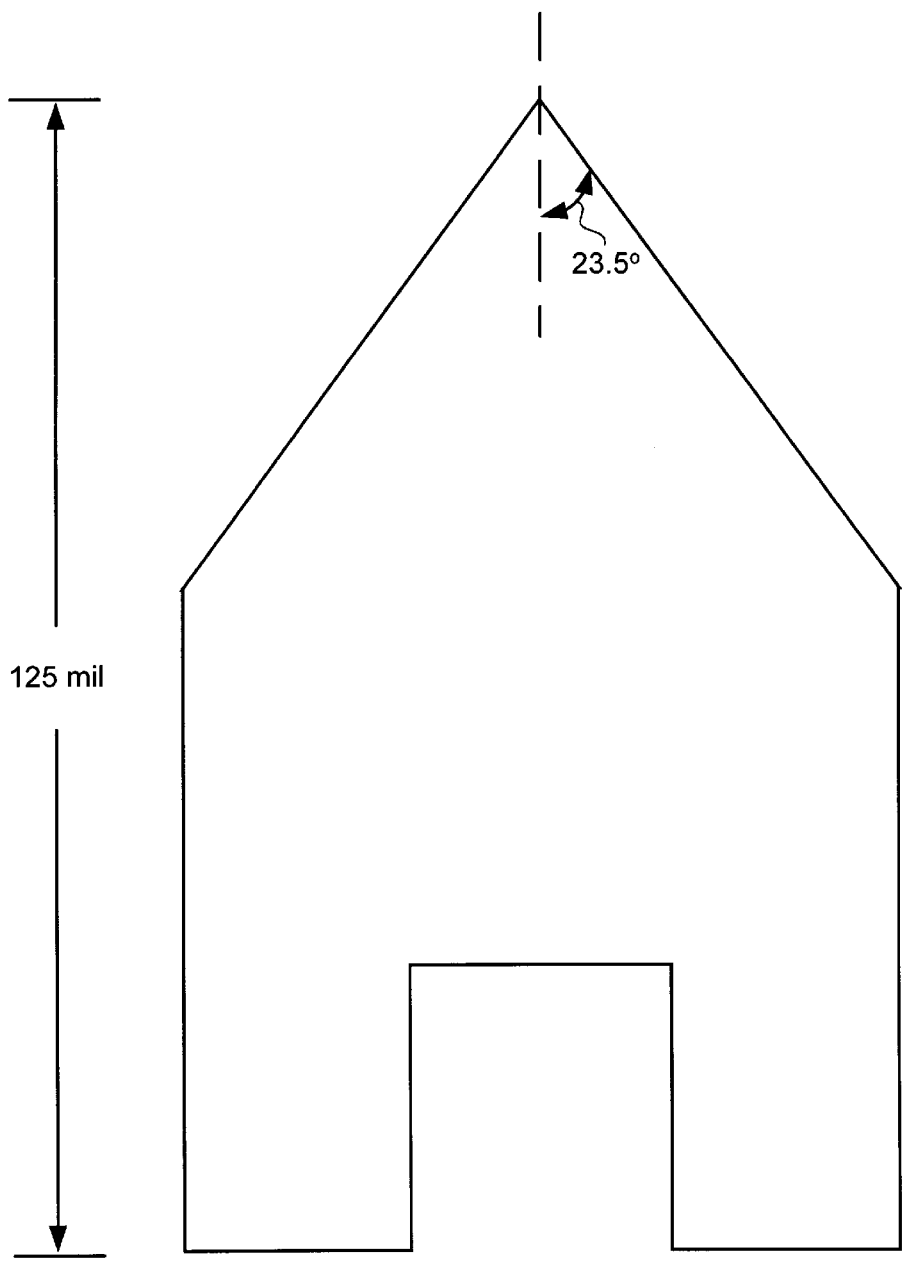
FIG. 4A illustrates, in accordance with one embodiment of the invention, a support used in the operation of a filler ring to maintain a specified gap distance.

As shown in FIG. 4, the filler ring 310 circumferentially supports the focus ring 302. The substrate 114 is supported by the chuck 116 (not shown). A group of supports 402 mechanically support the filler ring 310 at specified locations. In one aspect of the invention, the supports 402 are circumferentially located approximately 120 degrees apart and take the form of set screws. Such set screws have lengths and aspect ratios suitable for maintaining the gap distance "d" to within the desired range of less than 6 mils. In one case, the set screws can have a length of 125 mils (i.e., 0.125 inches) having an incline axis of 23.5 degrees as shown in FIG. 4A.

Figure 5:
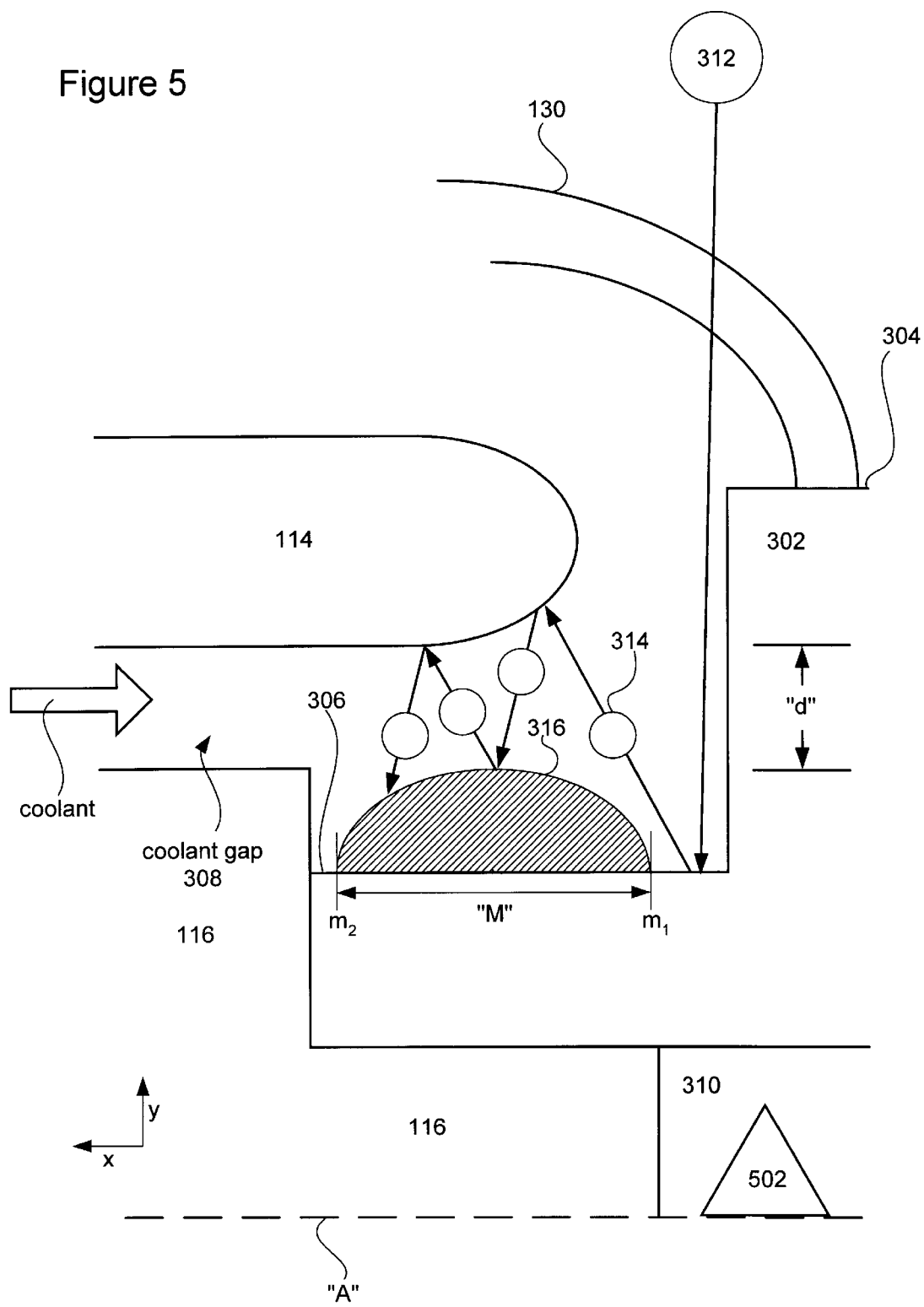
FIG. 5 illustrates in accordance with one embodiment of the present invention, a side view of the structure shown in FIG. 4 along a lateral cut "A".

Referring now to FIG. 5 which illustrates a cross section "A" of the focus ring/filler ring assembly shown in FIG. 4. The cross section "A" includes the support 502 intimately coupled to the filler ring 310. The supports 402 provide for the filler ring 310 to maintain the gap distance "d" to within a specified range. As noted above, in one aspect of the invention, the supports 402 provide the filler ring 310 with the ability to maintain the gap distance "d" to within a range of less than approximately 6 mils. In this way, the formation of a contamination layer formed by the ejection of focus ring material caused by the plasma can be controllably located.

Referring to FIG. 6, substrate 114 and chuck 116 are again shown. It should be noted that a coolant gap through with coolant gases flow is formed by the proximally positioning of the chuck 116 to the substrate 114. A ceramic focus ring 602 represents a focus ring substantially similar to that of focus ring 124 of FIGS. 1 and 2. It should be appreciated that in a specific system, the specific shape of the ceramic focus ring 602 may vary depending of the arrangement of chuck 116, substrate 114 and/or others. Therefore the exact shape of ceramic focus ring 602 of FIG. 6 is shown for illustration purposes only and in not limiting in any way.

A silicon hot edge ring 604 overlays an adjustable RF coupling ring 606. In the described embodiment, the adjustable RF coupling ring 606 is formed of aluminum having a gapping device 608. The gapping device 608 can include a plurality of set screws such as illustrated in FIG. 4A, for example, or any other suitably arranged device. In the described embodiment, a gap 610 formed between the substrate and the silicon hot edge ring 604 has a vertical dimension "d" controlled by the adjustable RF coupling ring 606. The adjustable RF coupling ring 606 is capable of controlling the vertical dimension "d" of the gap in many ways, one of which is accomplished by moving the silicon hot edge ring 604 in a vertical direction as appropriate. It should be noted that vertical direction is any direction substantially parallel to a "y" axis, as shown in FIG. 6. Similarly, a reference to horizontal direction, is that direction which is substantially parallel to an "x" axis also shown in FIG. 6.

In accordance with one embodiment of the invention, adjustable RF coupling ring 606 moveably supports the silicon hot edge ring 604. The adjustable RF coupling ring 606 provides therefore, mechanical support for the silicon hot edge ring 604 as well as the capability to control the gap distance "d" to within a specified range. In one aspect of the invention, adjustable RF coupling ring 606 is capable of forming the gap 610 with an associated gap distance "d" ranging between approximately 0.5 mils to less than 6 mils.

While the invention has been described in terms of several preferred embodiments, there are alterations, permutations, and equivalents which fall within the scope of this invention. For example, although the discussion is made herein with reference to a plasma etching reactor, the inventive filler ring may be employed in other plasma reactors as well, e.g., those employed for deposition. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method of controlling the formation of a contamination layer in a plasma processing system to within a prescribed location, said contamination layer being formed of at least an ion released from a selected surface having an associated surface potential by the action of a plasma ion upon said selected surface, said selected surface being included in said plasma processing system, comprising:

determining the approximate number of collisions between said selected surface and said released ion required to reduce the released ion's kinetic energy to approximately at most the surface potential of the selected surface; and arranging for said released ion to undergo said determined number of collisions such that it cannot escape said selected surface within said prescribed location.

2. A method of controlling the formation of a contamination layer in a plasma processing system to within a prescribed location as recited in claim 1, wherein said released ion has an initial kinetic energy being approximately equal to said plasma ion's average kinetic energy.

3. A method of controlling the formation of a contamination layer in a plasma processing system to within a prescribed location as recited in claim 2, further comprising:

determining the trajectory of said released ion associated with said collision with said selected surface;

determining a horizontal distance of travel associated with said trajectory; and determining a vertical distance of travel of said released ion based upon said trajectory such that said horizontal distance of travel multiplied by said approximate number of collisions is at most less than said prescribed distance.

4. A method of controlling the formation of a contamination layer in a plasma processing system to within a prescribed location as recited in claim 3, wherein said arranging comprises:

providing a second surface in proximate position to said selected surface, said second surface being located approximately at most said vertical distance of travel from said selected surface.

5. A method as recited in claim 4, wherein said plasma processing system includes a focus ring having an upper focus ring surface as said second surface and a substrate having a lower substrate surface as said selected surface, a substrate-holding chuck, and a filler ring configured to mechanically support at least a portion of the focus ring, said focus ring being configured to overlap at least a portion of the substrate-holding chuck that is powered by radio-frequency (RF) power during plasma operation to act as an electrode, said substrate being configured to overlap a portion of said focus ring that overlaps said portion of said substrate-holding chuck forming thereby a gap, said gap being useful for at least the removal of coolant gases from beneath the substrate during plasma operation, whereby said lower surface of said substrate forms an upper portion of said gap and said upper surface of said focus ring forms a lower portion of said gap, and wherein said filler ring comprises a filler ring body having an upper surface in mechanical support contact with said focus ring and a gapping device in direct contact with said filler ring body, wherein said providing further comprises setting a gap distance between said lower surface of the substrate and said upper surface of the focus ring by the gapping device, wherein said gap distance provides the capability for determining the location of the formation of a contamination layer formed within said gap when said focus ring is eroded during said plasma processing.

6. A method as recited in claim 5, wherein said gap distance is less than approximately 6 mils.

7. A method as recited in claim 5, wherein said gapping device includes a plurality of set screws.

8. A method as recited in claim 7, wherein said plurality of set screws are located in proximity to a lower portion of said filler ring.

9. A method as recited in claim 8, wherein said gapping device includes at least 3 set screws each being located approximately 120 degrees circumferentially from each other around said lower proximity of said filler ring body.

\* \* \* \* \*